United States Patent
Hua et al.

(10) Patent No.: US 7,190,187 B2
(45) Date of Patent: Mar. 13, 2007

(54) POWER GATING STRUCTURE HAVING DATA RETENTION AND INTERMEDIATE MODES

(75) Inventors: Chung-Hsien Hua, Sanjhih Township, Taipei County (TW); Wei Hwang, LeVerne, CA (US)

(73) Assignee: National Chiao Tung University, Hsinchu (TW)

( * ) Notice: Subject to any disclaimer, the term of this patent is extended or adjusted under 35 U.S.C. 154(b) by 127 days.

(21) Appl. No.: 11/129,749

(22) Filed: May 3, 2005

(65) Prior Publication Data
US 2006/0119393 A1 Jun. 8, 2006

(30) Foreign Application Priority Data
Dec. 2, 2004 (TW) .............................. 93137192 A (51) Int. Cl.
*H03K 17/16* (2006.01)
(52) U.S. Cl. .......................................... 326/27; 326/82
(58) Field of Classification Search .................. 326/26, 326/27, 38, 82, 57, 46
See application file for complete search history.

(56) References Cited

U.S. PATENT DOCUMENTS

| | | | |
|---|---|---|---|
| 6,552,601 B1 | 4/2003 | Burr | |
| 2003/0197544 A1 | 10/2003 | Burr | |
| 2006/0145726 A1* | 7/2006 | Hidaka | .................. 326/98 |

* cited by examiner

*Primary Examiner*—Don Le
(74) *Attorney, Agent, or Firm*—Bucknam and Archer (57) ABSTRACT

The present invention provides a power gating structure having data retention and intermediate modes and able to operate under multiple modes. A conventional power gating structure has only turn-on and turn-off functions, and is used to suppress a leakage current problem which has become more and more serious in advance manufacture processes, under a turn-off mode. However, in a memory circuit, such as latch, register and SRAM, when the power gate is turned off, a new power gating structure is required for data retention. The power gating structure of the present invention can be set into one of 4 different operational modes: a data retention mode for maintaining the static noise margin of the memory, an intermediate mode for reducing the interference on ground and power levels, an active mode used when the circuit operates in normal condition, and a standby mode used when the circuit does not operate.

14 Claims, 8 Drawing Sheets

(a) SNM graphical definition (b) SNM measurement setup

(a) Type 1   (b) Type 2   (c) Type 3

FIG. 6

(a) stacked NMOS power gating device   (b) stacked PMOS power gating device

POWER GATING STRUCTURE HAVING DATA RETENTION AND INTERMEDIATE MODES

BACKGROUND OF THE INVENTION

1. Field of the Invention

The present invention relates to a new power-gating structure, and in particular to a power-gating structure in which the data stored in volatile memories can be maintained when the system is in a standby mode, and a ground or power supply bounce caused at the switching of a power-gating device can be reduced.

2. Description of the Related Art

Figure 1:
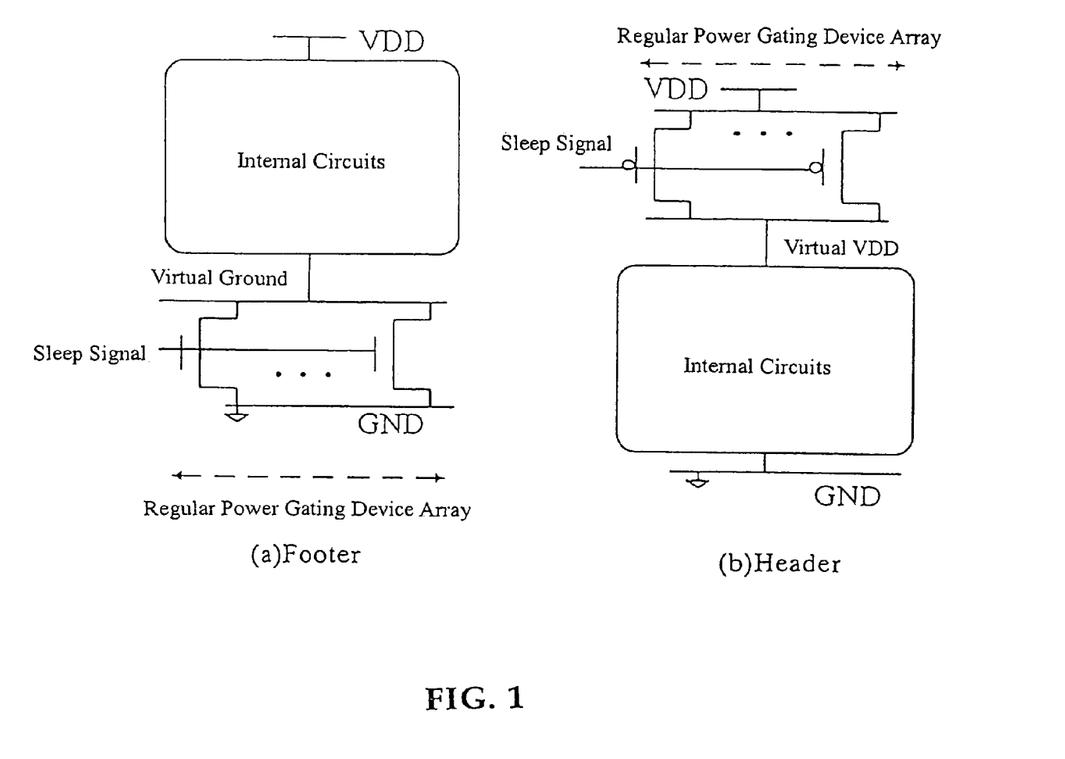
FIG. 1(a) shows a prior NMOS footer array power gating device.
FIG. 1(b) shows a prior PMOS footer array power gating device.

As shown in FIG. 1, prior power gating (control) devices can be classified into two, i.e. a footer device and a header device. The footer device is to interpose NMOS sleep transistors between a real ground and a virtual ground; and the header device is to interpose PMOS sleep transistors between a real voltage source (real VDD) and a virtual voltage source (virtual VDD). Moreover, an individual internal circuit can be a combination circuit or a sequential circuit; and the power gating device can receive a sleep signal from a power management unit which determines a current-adopted system power saving scenario. Although the prior power gating control method is practical for the combination circuit, the power gating devices can damage the static noise margin (SNM) of storage elements in the sequential circuit.

Figure 2:
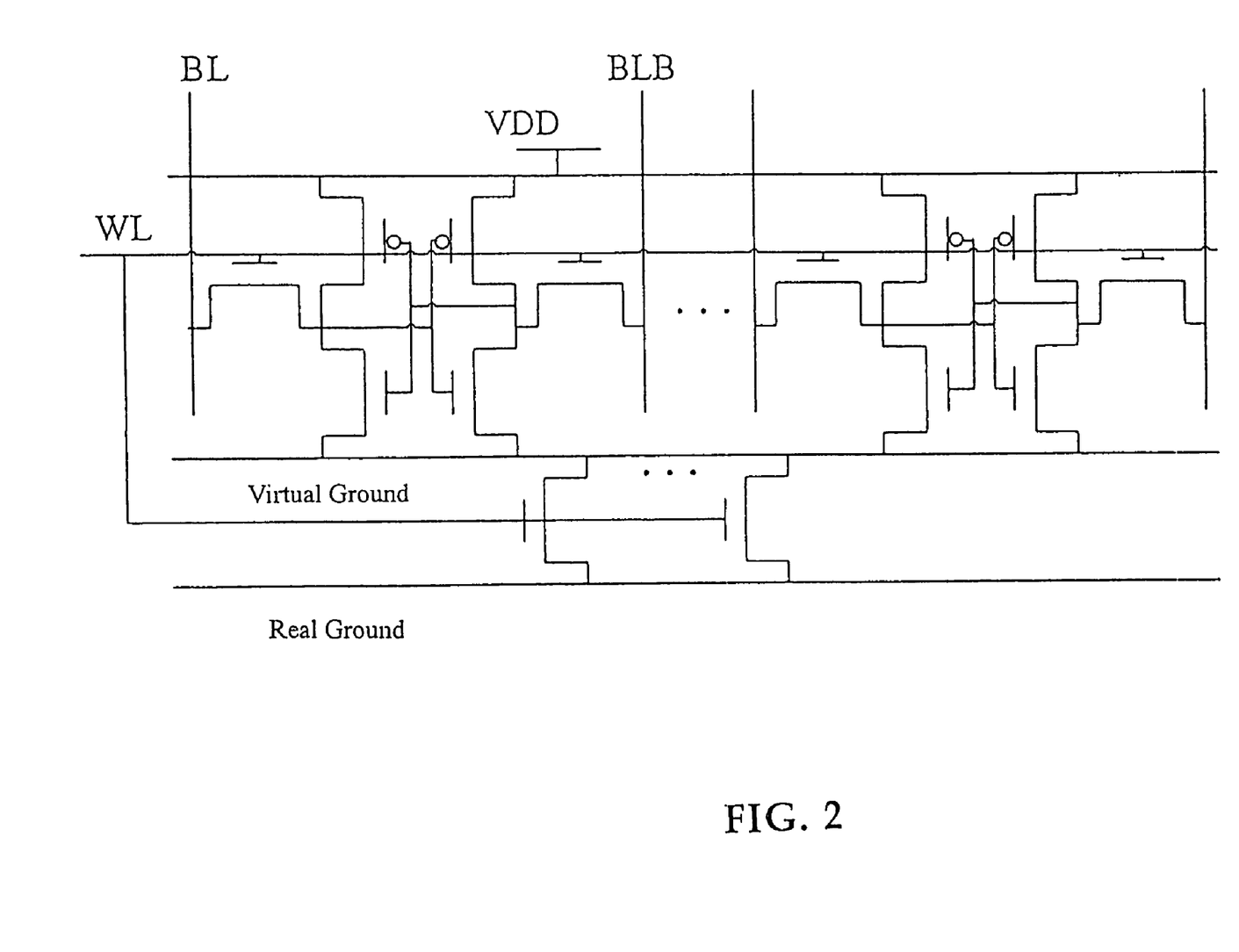
FIG. 2 shows a SRM array having a power gating device for reducing standby power consumption.

FIG. 2 shows a SRAM array having the power gating device. It can be obviously seen from Table 1 that SNM is 0 mV when the power gating device is turned off. It means that the data stored in the SRAM can not be guaranteed to be correct. However, during a standby mode, a 24× leakage current reduction can be achieved by using the prior power gating device.

Many publications propose a resolving scheme by using an MTCMOS as a power gate device. However, in an active mode, a transistor with a much higher threshold voltage used as a power gating device requires a larger silicon area to make the power gating device absorb a maximum instant current. Therefore, it is desired to use a single threshold voltage transistor as a power gating device or to adjust adaptively the well bias of the power gating device for reducing the area occupied by the power gating device.

For example, U.S. Pat. No. 6,552,601, entitled "Method for Supply Gating Low Power Electronic Device" and US Patent Application No. 2003/197544, entitled "Method and Structure for Supply Gated Electronic Components" disclose a power gating device. However, it belongs to a combination of Footer/Header in structure, and still can not be used in memory circuits.

In summary to the above, the prior power gating device has the following disadvantages: 1. a problem of maintaining data retention 2. A problem of reducing ground/power supply bounces caused during switching.

SUMMARY OF THE INVENTION

A primary objective of the present invention is to resolve the problems mentioned above in the conventional power gating structure, and to propose a data retention and intermediate modes combined power gating structure has concurrent data retention and intermediate modes, wherein the data retention and intermediate modes combined power gate is to arrange one or more NMOS/PMOS transistors between a virtual ground and a real ground or a virtual voltage source and a real voltage source, and one or more gate terminal(s) of the regular power gating device and/or the data retention power gating device can be controlled by a power management unit, so that the power gating device can have 4 operational modes: a data retention mode, an intermediate mode, an active mode and a standby mode. The main difference between the present invention and the above-mentioned patents is that an additional data retention function is included. This function is very important in memory circuits. And, through FIGS. 5, 6, 7 and 10, the main difference between the present invention and the above-mentioned patents can be seen clearly. Moreover, the present invention has 4 different operational modes and is quite different from the above-mentioned patents that only have two operational modes (turned-on and turned-off modes). Furthermore, the additional data retention mode and intermediate mode of the present invention play important roles in the power management of a system-on-a-chip.

Namely, when the prior power gating structure is in a standby mode-that is to say, when the power gating device is turned off, the data stored in an integrated circuit will be lost. Therefore, the conventional power gating structure is not suitable for volatile memory circuits, such as latch/register file/SRAM. Another conventional power gating device has the following problem: a ground bounce is induced at the switching of the power gating device, and if the power gating device is applied with a voltage source (VDD), a power supply bounce is encountered.

Furthermore, since the power gating structure of the present invention has data retention and intermediate modes, a secondary objective of the present invention is to resolve: 1. a problem of suppressing leakage current of the system-on-a-chip; 2. a problem of power management of the system-on-a-chip; 3. a problem of data loss in the volatile memories during the stand by mode; and 4. a problem of ground/power supply bounces caused at the switching of the power gating device.

The data retention and intermediate modes combined power gating structure proposed by the present invention can be set into one of 4 different operational modes: a data retention mode used for maintaining the static noise margin (SNM) of a memory an intermediate mode used for reducing the interference of power level an active mode used for normal operation in the circuit and a standby mode used when the circuit is not in operation.

Moreover, the power management of the system-on-a-chip needs to deal with the unprecedented increase in power density and leakage current. In all to-be-selected items, a voltage island having a power management unit is much more attractive in active or passive power reduction.

Furthermore, all active powers in the chip are reduced due to multi-supply voltages adopted. A block having tight timing constraints in calculation density is designated to a high supply voltage so as to maintain the efficiency of the entire system. Meanwhile, as long as timing is satisfactory, other blocks can be designated to a lower supply voltage so as to reduce active power consumption.

Due to the separation of voltage domains, circuits operating in the same voltage domains share the same properties, such as entering idle mode or current calculated data. Therefore, circuits in the same voltage island can be attached in the same set of power gating device, and can turn on or turn off all blocks at the same time.

Because of the progress in CMOS technology and the general requirement of mobile information devices, a standby power reduction has become an important topic.

Leakage current has become more serious in MOS transistors, and especially, sub-threshold and gate leakage currents in nano scale CMOS technology. After a power gating device is interposed between a virtual ground and an external real ground, the sub-threshold leakage current can be efficiently reduced, wherein the ground of the circuit in the chip is connected to the virtual ground. During the operation in an active mode, the power gating device serves as a mirror power rail impedance, which does not affect correctness in function. When a standby mode signal is asserted, the powder gating device acts as an open switch to disconnect the direct connection between the power supply and an internal circuit. This technology is quite useful to reduce the standby power, and can extend the lifetime of a battery for a mobile information device that at most of time stays in a standby mode.

In conclusion, the present invention has the following advantages: 1. The data stored in a volatile memory can be continuously maintained after the power switch is turned off to make the system enter a standby mode; 2. Ground/power supply bounces caused at the switching of the power switch are reduced; 3. 4 different operational modes are provided to reduce the complexity of the power management in the system-on-a-chip; 4. A new power gating structure can be provided to keep the ability of a conventional power gate in suppressing the leakage current of advanced process formed circuits. 5. The leakage current of the system-on-a-chip can be reduced without an additional manufacture process.

BRIEF DESCRIPTION OF THE DRAWINGS

Referring to the accompanying drawings, the features and inventiveness of the present invention will become much more obvious. In the drawings.

Table 1 shows the comparison between static noise margin and power consumption for many different types of power gating devices; and Table 2 shows control signals in different operational modes.

DESCRIPTION OF THE PREFERRED EMBODIMENTS

Figure 3:
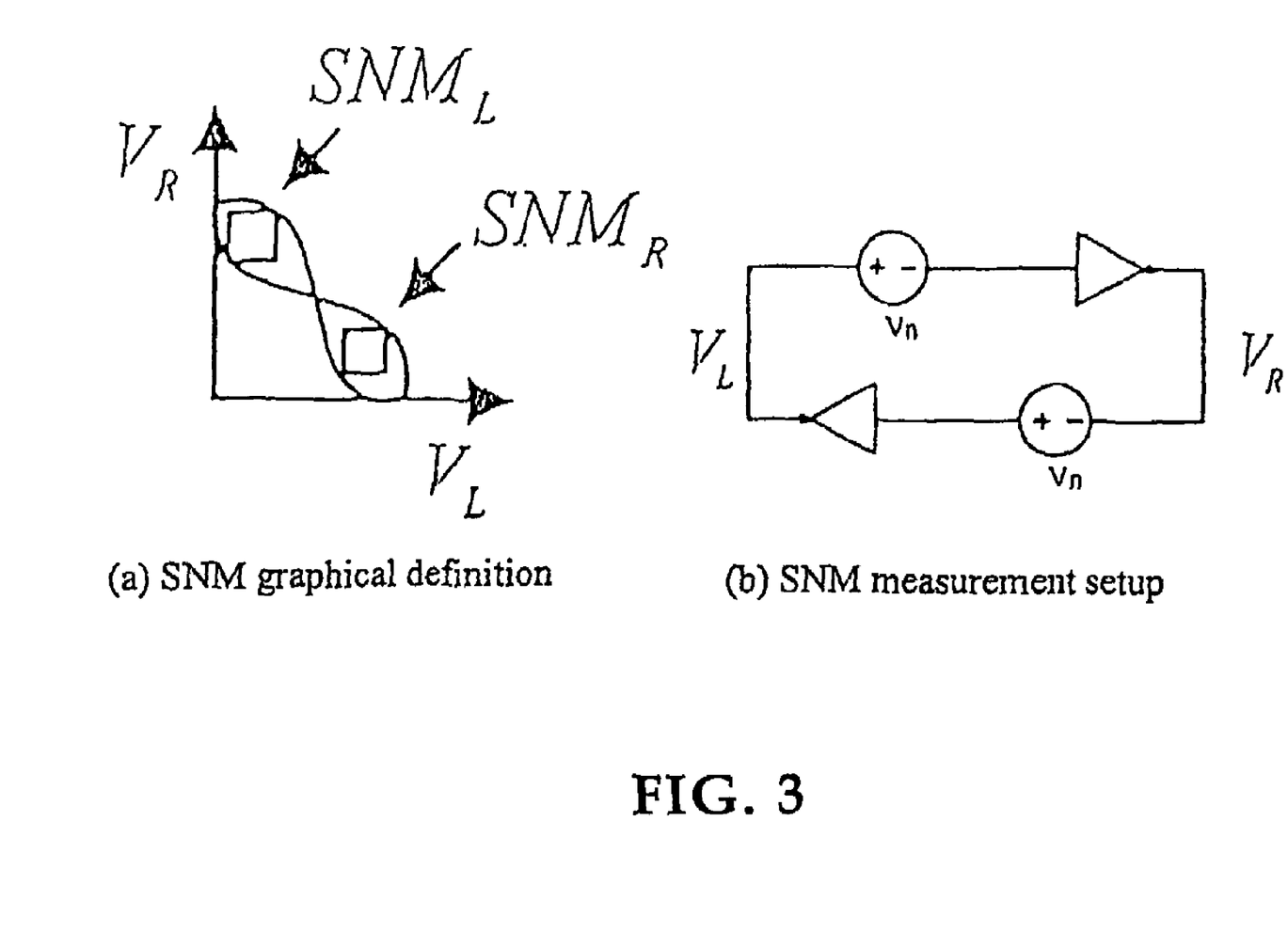
FIG. 3(a) is a graph showing the definition of static noise margin (SNM)
FIG. 3(b) shows a SNM measuring step.
Figure 4:
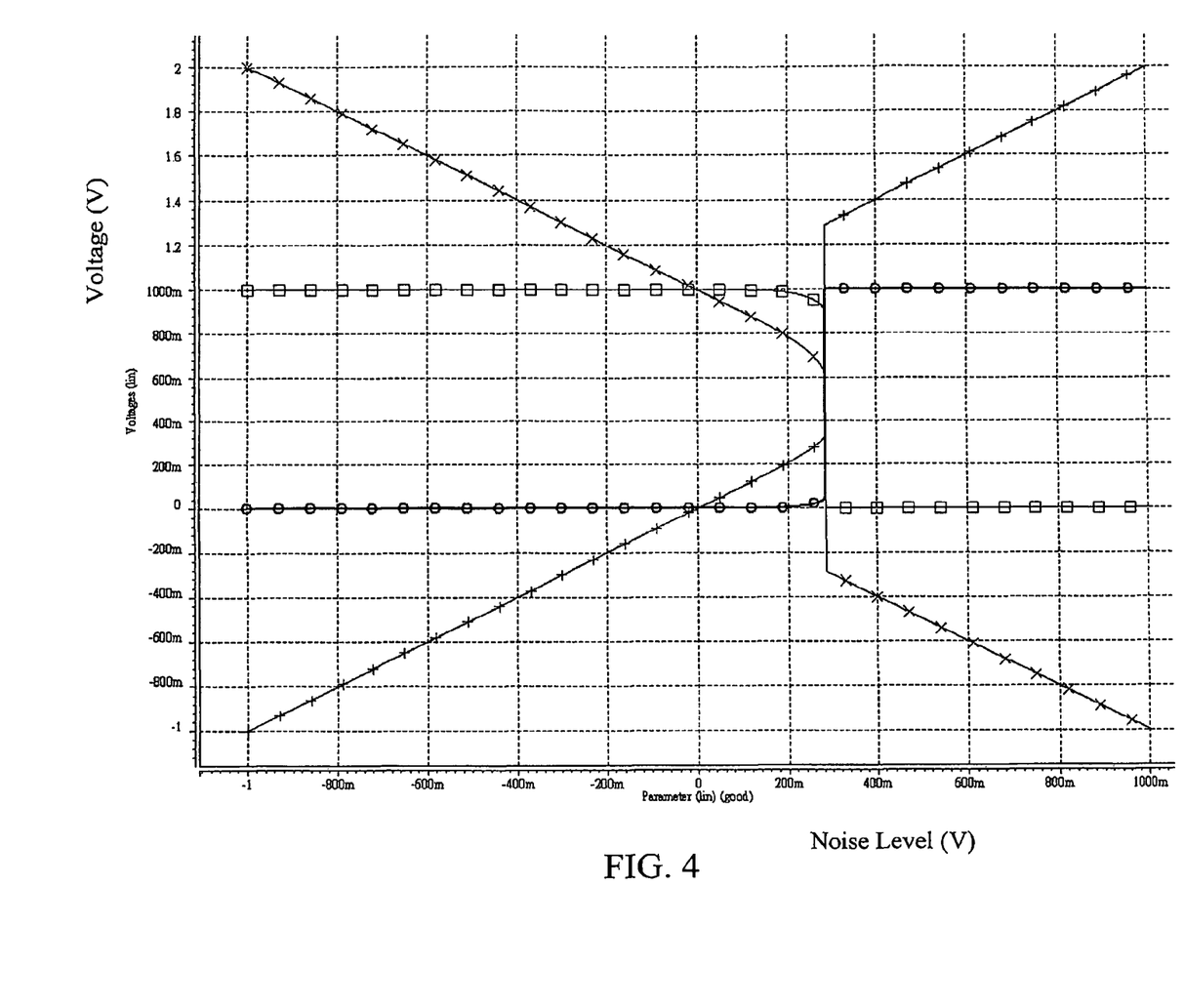
FIG. 4 shows a typical SNM simulation result, wherein X axis is the amplitude of the static noise, and the cross point of 4 curves is a point where the states of data are flipped due to static noises.

Referring to accompanying drawings, the features and inventiveness of the present invention are quite obvious. Cell stability determines soft-error and the sensitivity of a memory so as to deal with tolerances and operational conditions. FIG. 3(a) is a graph showing a static noise margin (SNM); FIG. 3(b) shows a step of measuring the static noise margin; and FIG. 4 shows a typical static noise margin simulation result. We can know from FIG. 4 that with the increase of the static noises, the data stored in the memory will gradually flip their states. After interposing all types of power gating device, we will use this method to test all static noise margins.

Figure 5:
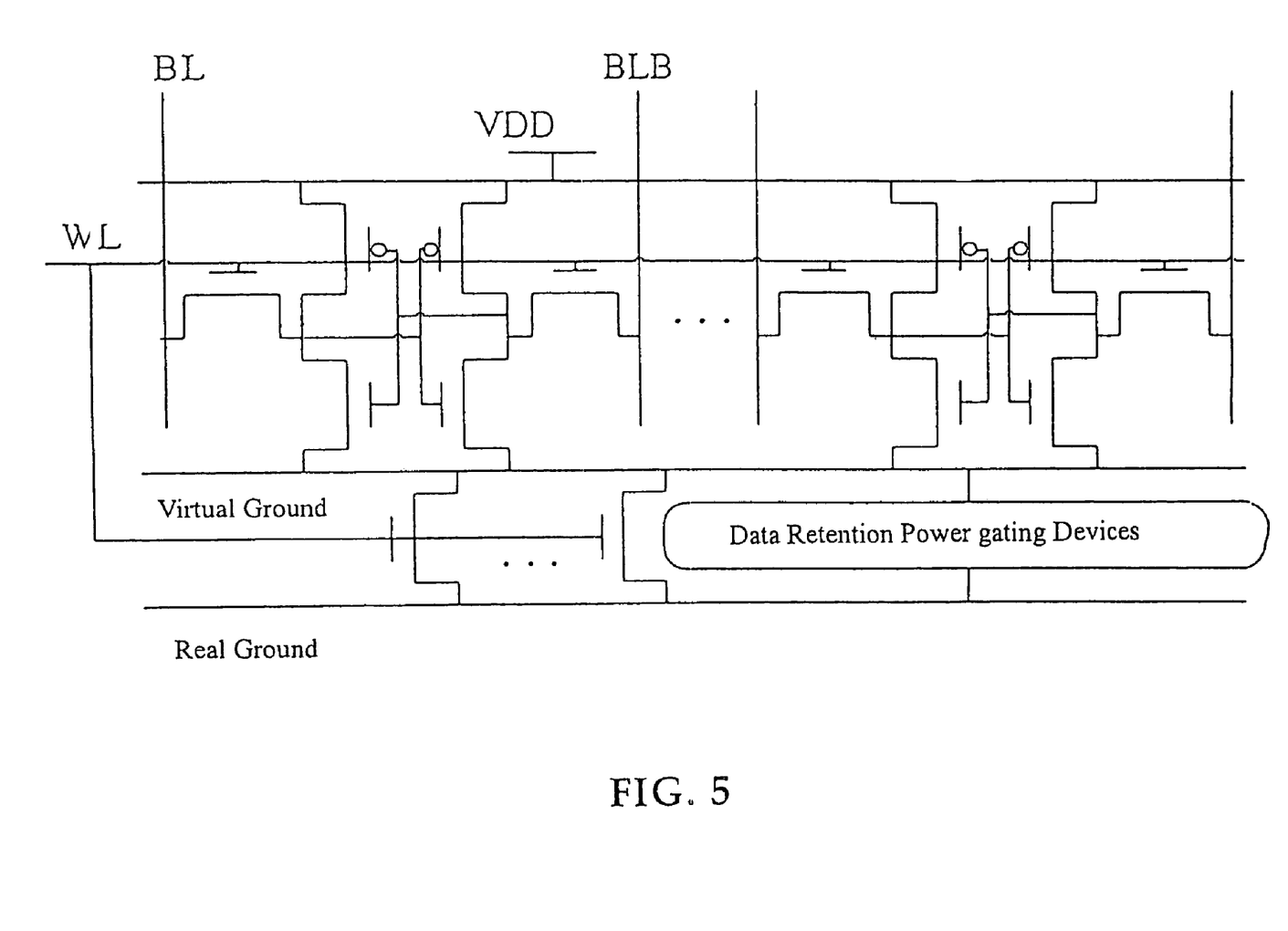
FIG. 5 shows a data retention power gating device having a regular power gating device for maintaining the static noise margin of storage elements in a standby mode.
Figure 6:
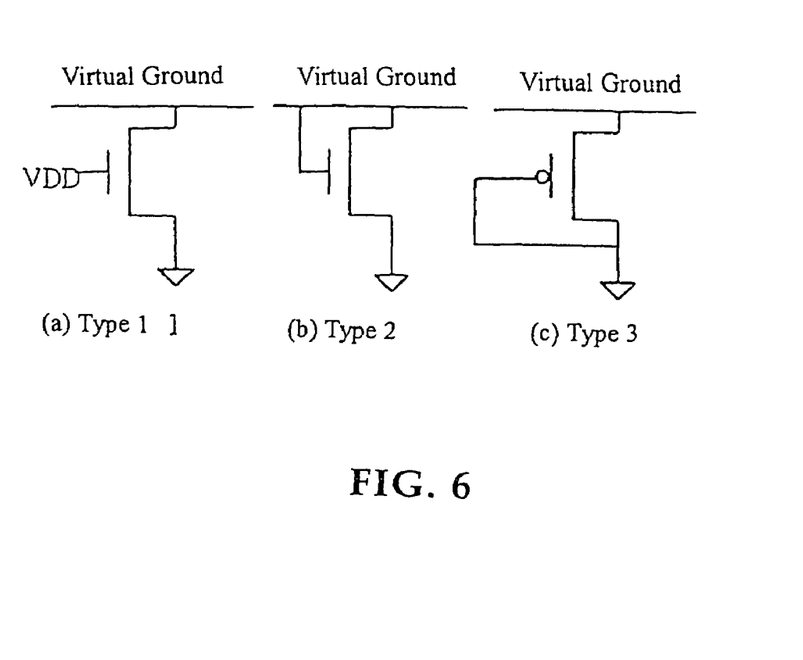
FIG. 6(a) shows an NMOS transistor of which the gate is applied with a specific voltage (a source voltage (VDD) in this example)
FIG. 6(b) shows an NMOS transistor of which the gate is connected to the drain to form a voltage control resistor.
FIG. 6(c) shows an PMOS transistor of which the gate is connected to a real ground to form a voltage control resistor.

We appreciate from the above that the prior power gating device can operate normally in the combination circuit. However, during a standby mode, storage elements require a power gating device (named as a data retention power gating device) to maintain the static noise margin. This structure is shown in FIG. 5, wherein the data retention power gating device is a general power gating device which is interposed in parallel. A set of power gating devices is shown in FIG. 6.

FIG. 6(a) shows a small type of NMOS transistor. The data retention power gating device is never turned off, and the gate of the NMOS transistor is applied with a specific voltage bias. Since this current connects a virtual ground and a real ground, the static noise margin can not be seen in any power gating devices. However, leakage current reduced by the data retention power gating device is very small.

Figure 7:
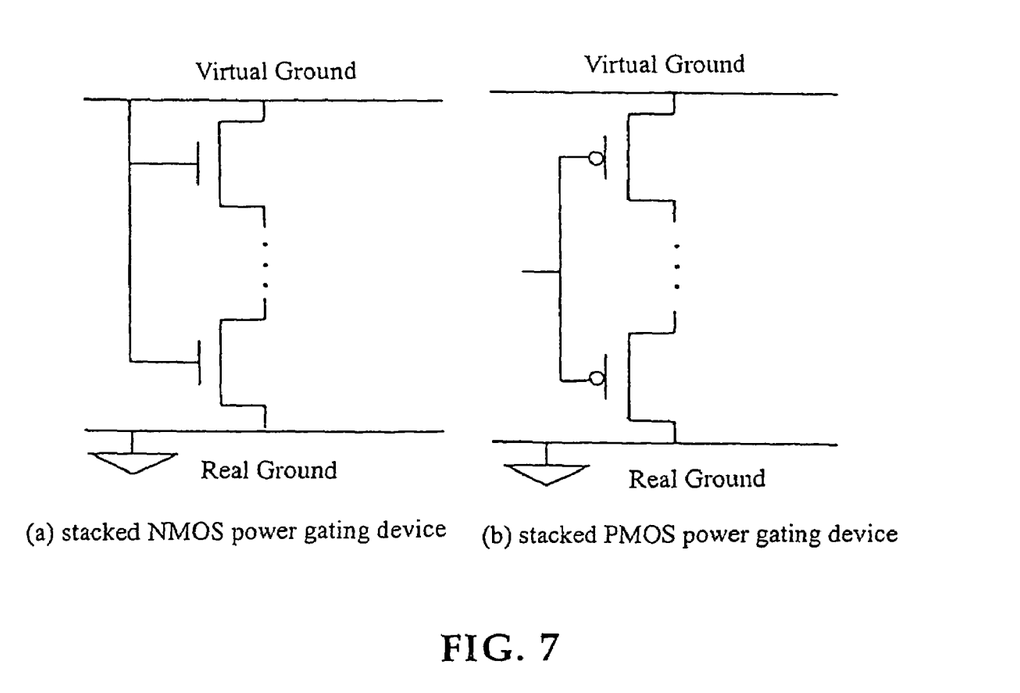
FIG. 7 are views showing modified data retention power gating devices in which the reciprocal SNM of NMOS or PMOS transistors are stacked for much lower leakage current.
Figure 8:
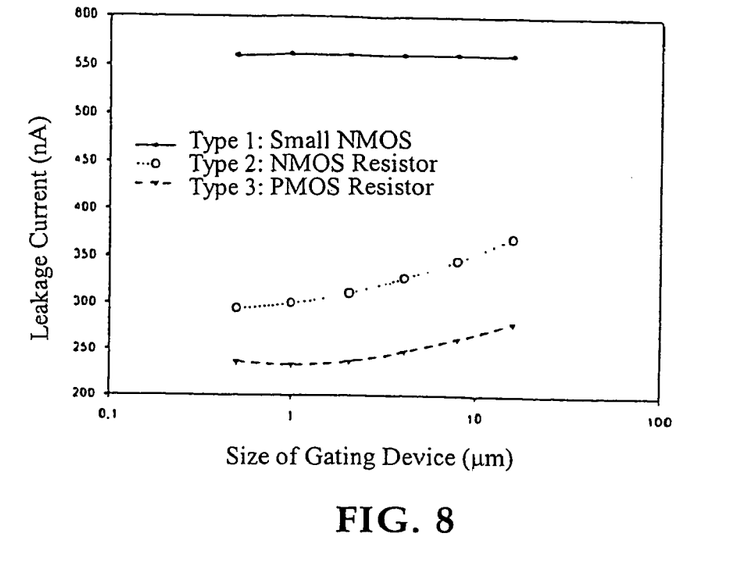
FIG. 8 shows the simulation result of the data retention power gating device—leakage current versus size of the data retention power gating device.
Figure 9:
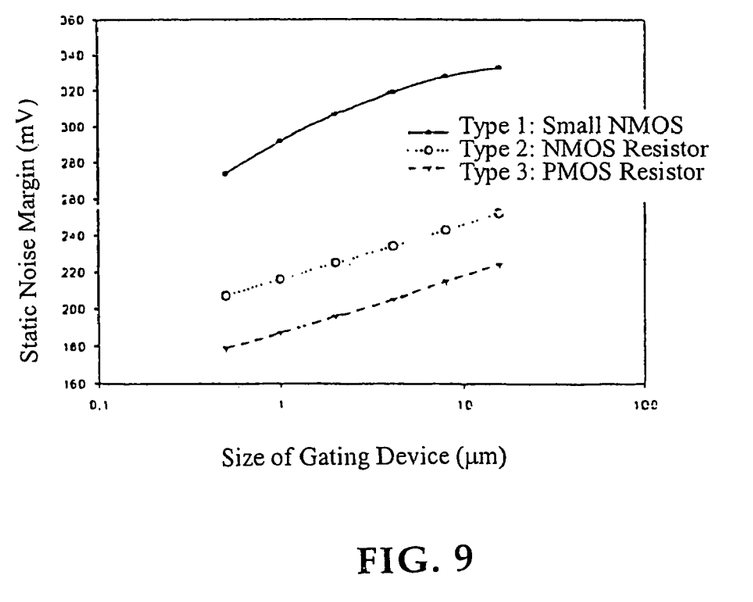
FIG. 9 shows the simulation result of the data retention power gating device—SNM versus size of the data retention power gating device.

FIG. 6(b) shows an NMOS transistor of which the gate and the drain are connected to each other to form a voltage control resistor. Meanwhile, during the operation in an active mode, the virtual ground is approximate to an equipotential. After the regular power gating device is turned off, the virtual ground becomes floating, and the leakage current starts to charge the virtual ground. At the beginning, the data retention power gating device acts as a high-impedance resistor. With the increase on the potential of the virtual ground, the equivalent impedance between the virtual ground and the real ground become much smaller, so that the potential of the virtual ground can be prevented from being further increased. Finally, the potential become balanced and stable. Due to the reduced potential difference between the source voltage (VDD) and the virtual ground, the static noise margin is declined, but it still falls within an acceptable range. The leakage current is reduced, but it is smaller than that reduced by a single conventional power gating device. As shown in Table 1, the second type of NMOS resistor data retention power gating device can reduce the original leakage current into half. The third type of PMOS resistor data retention power gating device shown in FIG. 6(c) is a counterpart to the second type of NMOS. If the second type of NMOS resistor and the third type of PMOS resistor have the same size, the third type of device shows a better inhibition ability for the leakage current because of higher equivalent impedance. The enhanced second and third type of data retention power gating structures for suppressing the leakage current are shown in FIG. 7(a) and FIG. 7(b). Since the static noise margin and the leakage current all have a direct relation to the equivalent resistance of the data retention power gate, the present invention also provides an enhanced data retention power gate in which NMOS/PMOS transistors are cascaded between the a virtual ground and a real ground (or a virtual source voltage and a real source voltage), and one or more gates of the NMOS transistors is/are connected to the virtual ground and the gates of the PMOS transistors are connected to a power management unit so as to obtain a high equivalent impedance and thus to control the amount of the leakage current. The most basic way is that the NMOS/PMOS transistors are cascaded or stacked to obtain a high equivalent impedance. Therefore, the static noise margin can be disregarded for obtaining a lower leakage current, or a larger leakage current is allowed to greatly increase the static noise margin. The simulation result of the third type of data retention power gating device is shown in FIG. 8 and FIG. 9. These two graphs clearly show that the amount of the leakage current and the static noise margin are all directly proportional to the size of the data retention power gating device, and can be considered as a reciprocal equivalent impedance.

In the above description, we introduce and show the use of the voltage control resistor that acts as the data retention power device and display the voltage control resistor's influence on the static noise margin and the reduced leakage current. Next, the concurrent cut-off and data retention power gating structure will be more deeply introduced.

Cut-Off and Data Retention Combined Power Gating Structure

Figure 10:
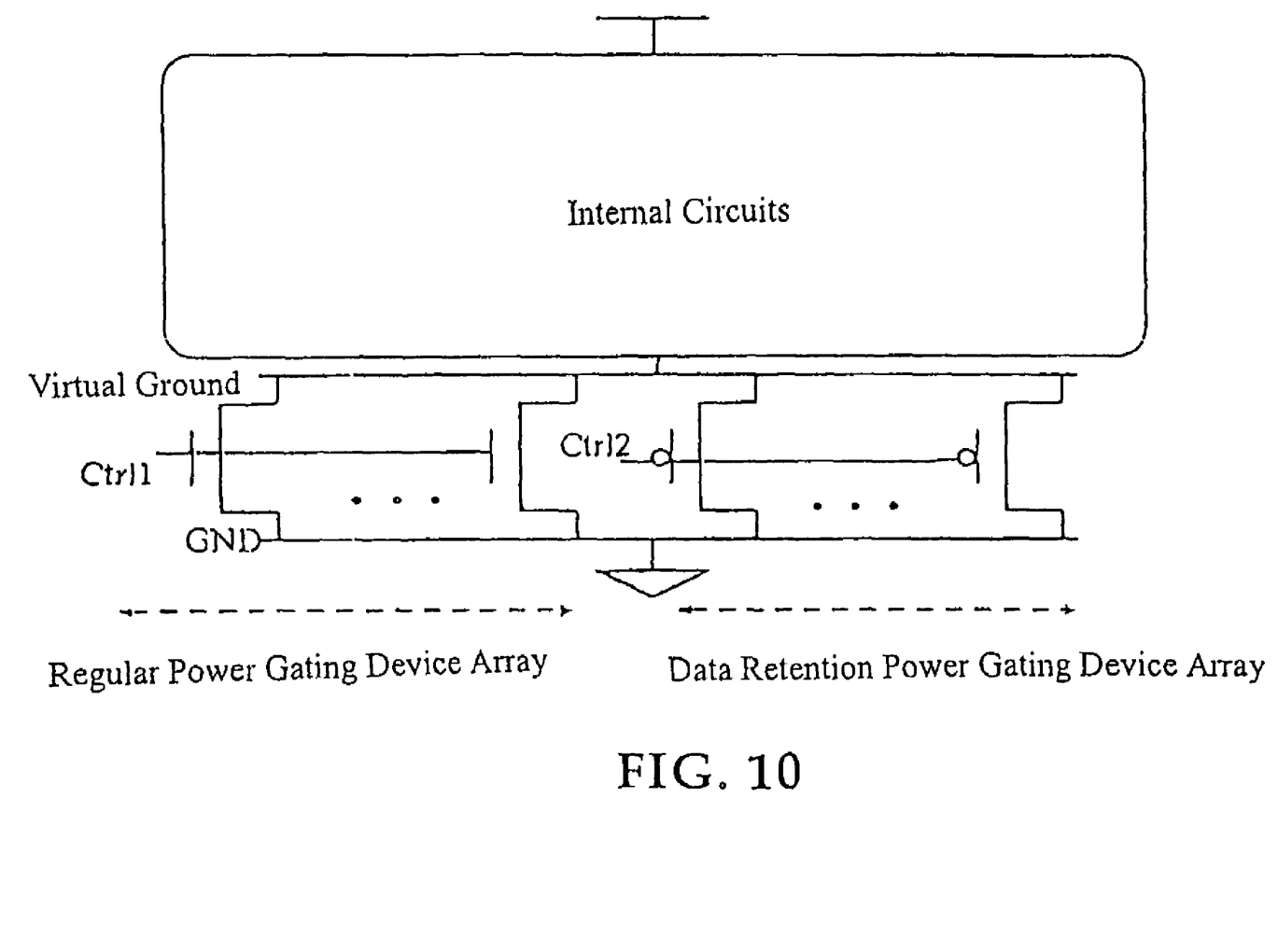
FIG. 10 shows a concurrent data retention and intermediate modes power gating structure.

From the above description for performance of the data retention power gating device, we realize that the inhibition ability for the leakage current relies on the difference in the order between the regular power gating device and the data retention power gating device. Therefore, once the data retention power gating device is interposed between the virtual ground and the real ground, the leakage current can not be acceptable in certain circumstance. Thus, the present invention modifies the third type of data retention power gating device, and has a power management unit for controlling the gates of the data retention power gating device (and regular power gating device). The detailed connection of this concurrent cut-off and data retention power gating structure is shown in FIG. 10, wherein the data retention and intermediate modes power gate is constructed by arranging one or more NMOS/PMOS transistors in parallel between a virtual ground and a real ground (or a virtual source voltage and a real source voltage), and one or more gate(s) of the regular power gating device and/or the data retention power gating device can be controlled by the power management unit, so that the data retention and intermediate modes power gating structure have 4 operational modes: a data retention mode, an intermediate mode, an active mode and a standby mode, and the operation thereof is described in detail as follows:

I. Active Mode: In FIG. 10, a Ctrl 1 signal is high, and a Ctrl 2 signal is low. Therefore, the regular power gating device and data retention power gating device both can support the full-speed operation of an internal circuit.

II. Standby/Cut Off Mode: In FIG. 10, the Ctrl 1 signal is low, and the Ctrl 2 signal is high. Since both of the regular power gating device and data retention power gating device are turned off, a 20× leakage current reduction can be achieved in this configuration. Although the data stored in storage elements will be damaged, it is allowed to damage the data in this operational mode.

III. Data Retention Mode: In FIG. 10, the Ctrl 1 signal is low, and the Ctrl 2 signal is low. In his operational mode, the regular power gating device, not the one for data retention, is turned off. Therefore, during the standby mode, the data stored in the storage elements can be maintained. However, the reduced amount of the leakage current is not larger than that in the cut off mode.

IV. Intermediate Mode: In FIG. 10, the Ctrl 1 signal is high, and the Ctrl 2 signal is also high. Namely, it is the intermediate mode during transitions of the foregoing three modes. In a mode transition, a ground bounce is undesired. Therefore, the intermediate mode is used to reduce the ground bounce. In Table 2, the summary in different mode operations and their individual control states are obviously shown.

Although the invention has been described in terms of the preferred embodiment, various performances and modifications can be made without departure from the spirit and scope of the present invention which is determined by the claims below.

TABLE 1

| Gating Style | No | Conv. | Type1: Small NMOS | Type2: N-resistor | Type3: P-resistor |
|---|---|---|---|---|---|
| SNM (mV) | 340 | ~0 | 308 | 195 | 163 |
| Stand-by Power (nW) | 561 | 22 | 558 | 28 | 22 |

TABLE 2

| Mode | Ctrl1 | Ctrl2 |
|---|---|---|
| Active | High | Low |
| Data-retention | Low | Low |
| Intermediate | High | High |
| Standby/Cut-off | Low | High |

DESCRIPTION OF MAIN ELEMENTS AND THE CORRESPONDING REFERENCE NUMERALS

VDD Source Voltage
GND Ground
PMOS P-type Metal Oxide Semiconductor
NMOS N-type Metal Oxide Semiconductor
Ctrl 1 Control Signal 1
Ctrl 2 Control Signal 2
SNM Static Noise Margin

What is claimed is:

1. A data retention and intermediate modes combined power gating structure, having a concurrent data retention and intermediate modes power gating structure, wherein the data retention and intermediate modes combined power gate is constructed by arranging one or more NMOS/PMOS transistors in parallel between a virtual ground and a real ground or a virtual source voltage and a real source voltage, and one or more gate(s) of the regular power gating device and/or the data retention power gating device is controlled by a power management unit, so that the data retention and intermediate modes combined power gating structure have 4 operational modes: a data retention mode, an intermediate mode, an active mode and a standby mode.

2. The power gating structure as claimed in claim 1, wherein the data retention mode is when the power gate is set into the data retention mode, the data stored in a memory are maintained under the standby state.

3. The power gating structure as claimed in claim 1, wherein the intermediate mode is a transition mode between the active mode and the standby mode for the purpose of reducing interference on the ground or power level during the mode transition, that is, reducing ground or power supply bounce.

4. The power gating structure as claimed in claim 1, wherein the active mode is a mode in which a circuit normally operates.

5. The power gating structure as claimed in claim 1, wherein the standby mode is a lowest leak current mode for the purpose of reducing the leakage current in a system-on-a-chip as best as possible when a circuit does not operate.

6. The power gating structure as claimed in claim 1, wherein the power gate is a data retention power gating device having the regular power gating device for maintaining the static noise margin of storage elements in the standby mode.

7. The power gating structure as claimed in claim 6, wherein the data retention power gate is composed of three different elements, that is, has a first type, a second type and a third type.

8. The power gating structure as claimed in claim 7, wherein the first type of data retention power gate is constructed by a smaller NMOS transistor, the gate voltage of the NMOS transistor is controlled to determine the equivalent resistance of the NMOS transistor, and the gate is not only biased with a source voltage (VDD), but also can be biased with other appropriate voltage values.

9. The power gating structure as claimed in claim 7, wherein the second type of data retention power gate is an NMOS transistor of which the gate and the drain are connected to each other to form a voltage control resistor so as to attain a data retention function.

10. The power gating structure as claimed in claim 7, wherein the third type of data retention power gate is an MPOS transistor of which the gate and the drain are connected to each other to form a voltage control resistor so as to attain a data retention function.

11. The power gating structure as claimed in claim 7, wherein the data retention power gate is a single transistor or multiple separated transistors.

12. The power gating structure as claimed in claim 1, wherein since the static noise margin and the leakage current both have a direct relation to the equivalent resistance of the data retention power gate, the data retention power gate further includes an enhanced data retention power gate in which NMOS/PMOS transistors are cascaded between a virtual ground and a real ground (or a virtual source voltage and a real source voltage), and one or more gates of the NMOS transistors is/are connected to the virtual ground and the gates of the PMOS transistors are connected to the power management unit so as to obtain a high equivalent impedance and thus to control the amount of the leakage current.

13. The power gating structure as claimed in claim 11, wherein the enhanced data retention power gate is to cascaded NMOS or PMOS transistors so as to attain the maximum equivalent resistance.

14. The power gating structure as claimed in claim 1, wherein the power management unit can be any signal sources.

* * * * *